(12) United States Patent
Saito (10) Patent No.: US 8,733,246 B2
(45) Date of Patent: May 27, 2014

(54) OFFSET PRINTING APPARATUS WHICH CAN ATTAIN HIGH POSITIONAL ACCURACY

(75) Inventor: Hiroshi Saito, Yokohama (JP)

(73) Assignee: IHI Corporation (JP)

( * ) Notice: Subject to any disclaimer, the term of this patent is extended or adjusted under 35 U.S.C. 154(b) by 84 days.

(21) Appl. No.: 13/377,012

(22) PCT Filed: Jun. 7, 2010

(86) PCT No.: PCT/JP2010/003776
§ 371 (c)(1),
(2), (4) Date: Dec. 8, 2011

(87) PCT Pub. No.: WO2010/143401
PCT Pub. Date: Dec. 16, 2010

(65) Prior Publication Data
US 2012/0079953 A1    Apr. 5, 2012

(30) Foreign Application Priority Data
Jun. 9, 2009 (JP) .................................. 2009-138698

(51) Int. Cl.
*B41F 3/26* (2006.01)
*B41F 3/51* (2006.01)
*B41F 3/60* (2006.01)

(52) U.S. Cl.
USPC ............................ 101/215; 101/158; 101/251

(58) Field of Classification Search
CPC ................ B41F 3/26; B41F 3/51; B41F 3/60; B41F 3/36
USPC ................................... 101/215, 251, 158, 316
See application file for complete search history.

(56) References Cited

U.S. PATENT DOCUMENTS

2007/0207869 A1 * 9/2007 Hunter .......................... 472/117
2008/0020128 A1 * 1/2008 van Ryper et al. ........... 427/2.11
2010/0024670 A1 * 2/2010 Takeda et al. .................. 101/316

FOREIGN PATENT DOCUMENTS

CN    2885577    4/2007
CN    1975525    6/2007

(Continued)

OTHER PUBLICATIONS

Samuel Chevailler, "Comparative Study and Selection Criteria of Linear Motors", published Jul. 3, 2006.*
Machine Translation of JP 2005-031191 to Ono et al. published on Feb. 3, 2005.*
Machine Translation of JP 3904433 to Atsushi et al. published on Apr. 11, 2007.*

(Continued)

*Primary Examiner* — Judy Nguyen
*Assistant Examiner* — Blake A Tankersley
(74) *Attorney, Agent, or Firm* — Ostrolenk Faber LLP (57) ABSTRACT

An offset printing apparatus includes a frame; guide rails that are provided on the frame; a plurality of guide blocks that are provided on the guide rails; a plate table that travels via one portion of the guide blocks among the plurality of guide blocks; a print target table that travels via another portion of the guide blocks among the plurality of guide blocks; and a blanket roll that is provided on the frame; wherein transfer from the plate to the blanket roll, and retransfer from the blanket roll to the print target are performed by causing the blanket roll to successively make contact from above with a plate that is held on the plate table, and a print target that is held on the print target table; a step portion for positioning that consists of a vertical surface that is formed by a machining process so that the linearity increases and a horizontal surface is provided at mounting locations of the guide rails on the upper surface portion of the frame; and one side surface and the bottom surface of the guide rails are pressed against the vertical surface and the horizontal surface of the step portion, respectively, to be fixed.

5 Claims, 5 Drawing Sheets (56) References Cited

FOREIGN PATENT DOCUMENTS

| JP | 50-031042 | 9/1975 |
| JP | 2797567 | 9/1998 |
| JP | 2002-059529 | 2/2002 |
| JP | 3904433 | 4/2007 |
| JP | 2008-129362 | 6/2008 |
| JP | 4108012 | 6/2008 |
| TW | I220669 | 9/2004 |
| TW | M346481 | 12/2008 |
| TW | M355141 | 4/2009 |

OTHER PUBLICATIONS

Taiwan Office Action, dated Jun. 19, 2012, issued in corresponding Taiwan Application No. 099118504. English translation included. Total 7 pages.

International Search Report and Written Opinion mailed Jul. 13, 2010 in corresponding PCT International Application No. PCT/JP2010/003776.

Chinese Office Action mailed on Nov. 27, 2013 issued in corresponding Chinese Application No. 201080034963.3 (with English translation of Search Report).

* cited by examiner

OFFSET PRINTING APPARATUS WHICH CAN ATTAIN HIGH POSITIONAL ACCURACY

CROSS-REFERENCE TO RELATED APPLICATIONS

The present application is a 35 U.S.C. §§371 national phase conversion of PCT/JP2010/003776, filed Jun. 7, 2010, which claims priority of Japanese Patent Application No. 2009-138698, filed Jun. 9, 2009, the contents of which are incorporated herein by reference. The PCT International Application was published in the Japanese language.

TECHNICAL FIELD

The present invention relates to an offset printing apparatus that is used for printing a fine printing pattern on a print target with high printing accuracy, when forming an electrode pattern on a substrate by printing, for example.

BACKGROUND ART

Offset printing is one type of printing technique. In offset printing that uses engraved plates, after once transferring ink to a rolling blanket roll from an inked, engraved plate (reception), the retransfer of the ink to the print target from the blanket roll (printing) is performed. Thereby, it is possible to print the print pattern of the aforementioned engraved plate with good reproducibility on the surface of the print target.

In recent years, as a method of forming an electrode pattern such as of a liquid crystal display (conductive pattern) on a substrate, instead of fine processing such as etching of a metal vapor-deposited film, there as been provided a formation method that prints the conductive pattern on a substrate serving as a print target using a printing technique that uses a conductive paste as the printing ink, for example, intaglio offset printing technology (for example, refer to Japanese Patent No. 2797567 and Japanese Patent No. 3904433).

In the case of forming an electrode pattern (conductive pattern) such as of a liquid crystal display on a substrate, a fine electrode width of around 10 µm has been sought. Furthermore, in the case of forming a plurality of electrode patterns in a superimposed manner on a substrate, overprinting of the electrode patterns is performed by using different plates. In this case, when the print position shifts, the electrode pattern collapses. Therefore, although the precision required varies somewhat with the target, in a fine electrode pattern in which the electrode width is 10 µm, extremely high positional accuracy is required so as to restrict overlap misalignment to several µm.

As an offset printing apparatus for performing offset printing with high printing accuracy on a print target, a planographic printer is used that employs a planar plate similar to the print target as the plate.

Figure 4:
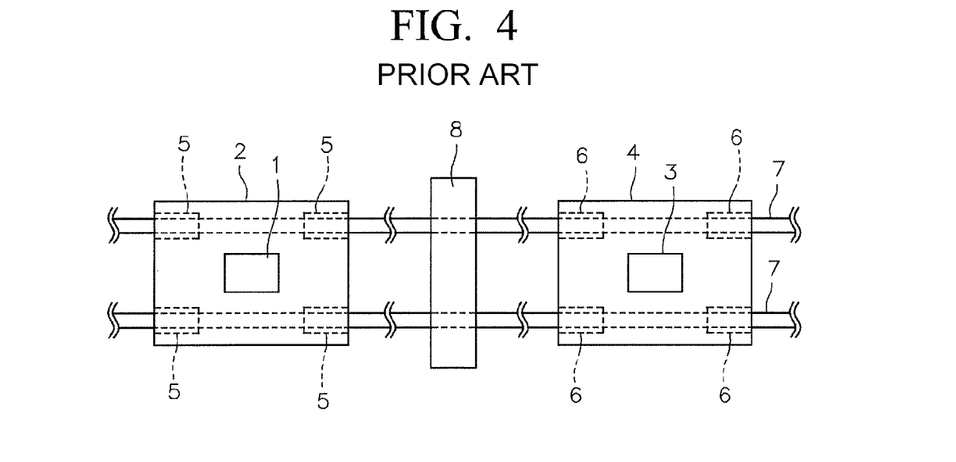
FIG. 4 is an outline plan view that shows a conventional offset printing apparatus.

Moreover, as one method of minimizing positioning errors between the blanket roll and the plate or print target when performing offset printing in order to improve the print accuracy, the printing apparatus shown in FIG. 4 has been proposed. In this printing apparatus, sliders 5 and 6 are provided under a plate truck (plate table) 2 that supports a plate bed (not illustrated) on which a flat plate 1 is mounted, and a printing truck (print target table) 4 that supports a printing bed (not illustrated) on which a glass substrate 3 that is the printing target (object to be printed) is mounted. These sliders 5 and 6 respectively have the same dimensions, and are firmly fixed to the bottom of the plate truck 2 and the printing truck 4 in the same arrangement. The plate truck 2 and the printing truck 4 are provided so as to travel (reciprocally move) via the sliders 5 and 6, respectively, on the same rails (guide rails) 7. Moreover, a blanket cylinder (blanket roll) 8 is provided so as to straddle the rails 7.

According to this constitution, even if the straightness of the rails 7 decreases directly under the blanket cylinder 8, and thereby the attitudes of the plate truck 2 and the printing truck 4 tilt at that position, both trucks 2 and 4 will have the same tilt. Accordingly, since attitude errors between the plate 1 and the glass substrate 3 are inhibited, and the transfer between the plate 1 and the blanket cylinder 8 (resin transfer) and the retransfer from the blanket cylinder 8 to the glass substrate 3 (pattern transfer) are performed at the same position, it is possible to increase the printing accuracy (for example, refer to Japanese Unexamined Patent Application, First Publication No. 2008-129362).

Figure 5:
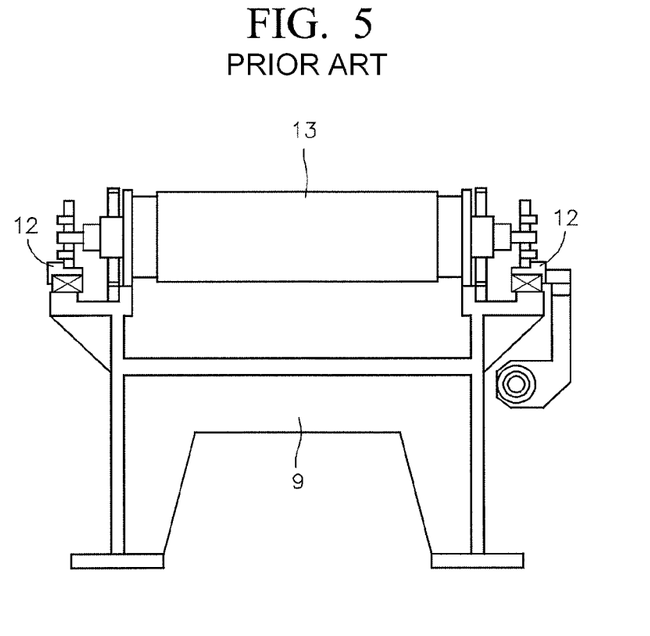
FIG. 5 is an outline elevation view that shows a conventional resin-coated substrate manufacturing apparatus.
Figure 6:
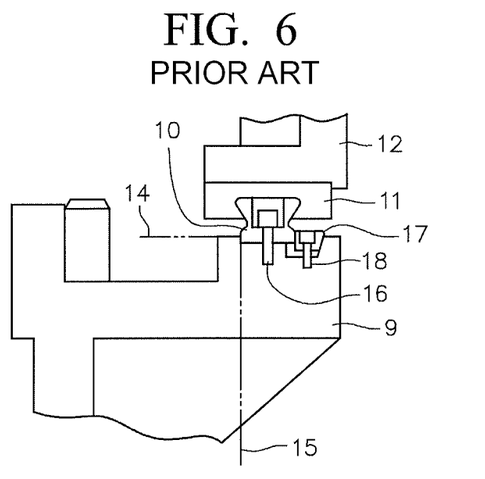
FIG. 6 is a elevational view that shows in an enlarged manner the guide rail mounting structure at one side portion of the fixing frame in the resin-coated substrate manufacturing apparatus of FIG. 5.

Also, Japanese Patent No. 4108012 discloses a resin-coated substrate manufacturing apparatus that is shown in FIG. 5 and FIG. 6. In this resin coated substrate manufacturing device, a left-right pair of guide rails 10 extending in the front-back direction are installed on both sides of a fixed frame 9, and a left-right pair of sliders 11 are slidably attached to the guide rails 10. By attaching on the pair of sliders 11 a left-right pair of movable frames 12 that hold left-right rotating shafts of a transfer cylinder 13 to allow free rotation, it is possible to move the transfer cylinder 13 in the front-back direction, relative to the fixed frame 9, together with the left-right movable frames 12 in tandem with movement of each slider 11 along the guide rail 10. The resin coated substrate is manufactured by letterpress reverse printing to a substrate serving as the print target, not illustrated, that is held on the fixed frame 9, via the transfer cylinder 13, from a relief plate not illustrated that is fixed to the fixed frame 9. Also, a pair of horizontal planes 14 and a pair of vertical planes 15 for supporting the guide rails 10 in a vertical direction and horizontal direction are provided on both side portions of the fixed frame 9 by a polishing process so that the respective linearity may become high. The left-right pair of guide rails 10 are respectively attached and fixed in a pressed state to the horizontal plane 14 and the vertical plane 15, which are provided on the left and right of the fixed frame 9, by a plurality of fixing bolts 16 serving as a horizontal plane pressing portion, and wedge-shaped fixing plates 17 and fixing bolts 18 thereof that serve as a vertical plane fixing portion. Thereby, disturbances to the linearity and parallelism of the guide rails 10 are reduced (for example, refer to Japanese Patent No. 4108012).

However, in the method disclosed in Japanese Unexamined Patent Application, First Publication No. 2008-129362, although it is possible to ensure the position reproducibility of the plate 1 and the print target 3 with respect to the blanket cylinder 8, it is not possible to guarantee absolute straightness accuracy. For that reason, when the plate 1 and the print target 3 advance in a slanted direction with respect to a direction that is at a right angle to the axial center of the blanket cylinder 8 in a state of making contact with the blanket cylinder 8, during the transfer from the plate 1 to the blanket cylinder 8, and when performing the retransfer from the blanket cylinder 8 to the print target 3, there is a possibility of a disturbance occurring in the print pattern. Accordingly, even if it is possible to satisfy the print accuracy that is conventionally required, it is difficult to attain extremely high positional accuracy in the case of there being a need to restrict position misalignment of a fine print pattern, such as in electrode pattern formation, to several µm.

Also, in the device that performs letterpress reverse printing disclosed in Japanese Patent No. 4108012, since the transfer cylinder 13 moves, it is difficult to reduce positional variations when bringing the transfer cylinder 13 into contact with substrates serving as the relief plate or print target, not illustrated, that are held on the fixed frame 9.

Furthermore, in the device disclosed in Japanese Patent No. 4108012, it is possible to reduce disturbances to the linearity and parallelism of the guide rails 10. However, the left and right movable frames 12 that are attached to the sliders 11 that slide along the guide rails 10 are coupled via the transfer cylinder 13 that rotates. Accordingly, when even a slight positional misalignment of the left and right movable frames 12 occurs in the front-back direction, it is no longer possible to cause the transfer cylinder 13 to squarely face the substrates serving as the relief plate or print target, not illustrated, that are fixed on the fixed frame 9. For that reason, even if it is possible to satisfy the print accuracy that is conventionally required, it is difficult to attain extremely high positional accuracy in the case of there being a need to restrict position misalignment of a fine print pattern, such as in electrode pattern formation, to several μm.

The present invention was achieved in view of the above circumstances, and has as its object to provide an offset printing apparatus that can attain positional reproducibility of high accuracy when performing transfer from a plate to a blanket roll, and when performing retransfer from a blanket roll to a print target, and can attain extremely high positional accuracy in the case of there being a need to restrict position misalignment of a fine print pattern, such as in electrode pattern formation, to several μm.

DISCLOSURE OF THE INVENTION

The offset printing apparatus of one aspect of the present invention includes: a frame; guide rails that are provided on the frame; a plurality of guide blocks that are provided on the guide rails; a plate table that travels via one portion of the guide blocks among the plurality of guide blocks; a print target table that travels via another portion of guide blocks among the plurality of guide blocks; and a blanket roll that is provided on the frame; wherein transfer from the plate to the blanket roll, and retransfer from the blanket roll to the print target are performed by causing the blanket roll to successively make contact from above with a plate that is held on the plate table, and a print target that is held on the print target table; a step portion for positioning that consists of a vertical surface that is formed by a machining process so that the linearity increases and a horizontal surface is provided at mounting locations of the guide rails on the upper surface portion of the frame; and one side surface and the bottom surface of the guide rails are pressed against the vertical surface and the horizontal surface of the step portion, respectively, to be fixed.

Also, the offset printing apparatus of another aspect of the present invention includes: a frame; guide rails that are provided on the frame; a plurality of guide blocks that are provided on the guide rails; a plate table that travels via one portion of the guide blocks among the plurality of guide blocks; a print target table that travels via another portion of guide blocks among the plurality of guide blocks; and a blanket roll that is provided on the frame; wherein transfer from the plate to the blanket roll, and retransfer from the blanket roll to the print target are performed by causing the blanket roll to successively make contact from above with a plate that is held on the plate table, and a print target that is held on the print target table; a step portion for positioning that consists of a vertical surface that is formed by a machining process so that the linearity increases and a horizontal surface is provided at mounting locations of the guide rails on the upper surface portion of the frame; one side surface and the bottom surface of the guide rails are pressed against the vertical surface and the horizontal surface of the step portion to be fixed; a step portion that consists of a vertical surface that is formed by a machining process so that the linearity increases and a horizontal surface is provided at a location that is arranged above the guide rails at the bottom surface portion of the plate table and the print target table; and one side surface and the upper surface of the guide blocks are pressed against the vertical surface and the horizontal surface of the step portion, respectively, to fix them.

Furthermore, in the offset printing apparatus of the present invention, the mounting locations of the guide rails on the upper surface portion of the frame may be two locations spaced apart by a predetermined interval, and the step portion may be provided at each of the mounting locations of the guide rails so as to both face outward in the width direction or both face inward in the width direction.

Furthermore, in the offset printing apparatus of the present invention, a step portion that consists of a vertical surface that is formed by a machining process so that the linearity increases and a horizontal surface may be provided at the center portion in the width direction of the frame in a parallel manner to the step portion provided at the mounting locations of the guide rails on the upper surface portion of the frame; one side surface and the lower surface of a stator of a linear motor may be mounted in a state of being pressed against the vertical surface and the horizontal surface of the step portion at the center portion in the width direction of the frame; a step portion that consists of a vertical surface that is formed by a machining process so that the linearity increases and a horizontal surface may be provided at the center portion in the width direction of the bottom surface portion of the plate table and the print target table; and one side surface and the upper surface of a reaction plate of the linear motor may be mounted in a state of being pressed against the vertical surface and the horizontal surface of the step portion at the center portion in the width direction of the bottom surface portion of the plate table and the print target table.

Furthermore, in the offset printing apparatus of the present invention, a step portion may be provided that consists of a vertical surface that is formed by a machining process so that the linearity increases and a horizontal surface at a predetermined location on the upper surface portion of the frame in a parallel manner to the step portion provided at the mounting locations of the guide rails on the upper surface portion of the frame; and one side surface and the bottom surface of a linear scale may be mounted by being pressed against the vertical surface and the horizontal surface of the step portion provided at the predetermined location on the upper surface portion of the frame.

EFFECTS OF THE INVENTION

The offset printing apparatus of the present invention exhibits the following superior effects.

(1) The offset printing apparatus of the present invention includes a plate table and a print target table that travel via individual blocks on guide rails provided on a frame, and by causing a blanket roll to successively make contact from above with a plate that is held on the plate table, and a print target that is held on the print target table, performs transfer from the plate to the blanket roll, and retransfer from the blanket roll to the print target. A step portion for positioning that consists of a vertical surface that is formed by a machining process so that the linearity increases and a horizontal surface that is aligned to a horizontal plane is provided at the mounting locations of the left and right guide rails on the upper surface portion of the frame. By pressing and fixing one side surface and the bottom surface of each guide rail that serve as reference surfaces against the vertical surface and the horizontal surface of this step portion, respectively, the plate on the plate table and the print target on the print target table that travel along the guide rails that are fixed along the step portion with high linearity make contact with the blanket roll in a state of their straightness being increased. Accordingly, it is possible to increase the reproducibility of a position when the plate on the plate table makes contact with the blanket roll, and the position when the print target on the print target table makes contact with the blanket roll. Therefore, it is possible to print the print pattern of the plate on the print target via the blanket roll with high positional accuracy and high reproducibility. Therefore, it is possible to attain extremely high positional accuracy in the case of there being a need to restrict position misalignment of a fine print pattern, such as in electrode pattern formation, to several (2) Moreover, by providing a step portion that consists of a vertical surface that is formed by a machining process so that the linearity increases and a horizontal surface at a location that is arranged above the guide rails at the bottom surface portion of the plate table and the print target table, and pressing and fixing the one side surface and the upper surface that serve as reference surfaces of the guide block corresponding to the guide rails against the vertical surface and horizontal surface of this step portion, the plate on the plate table and the print target on the print target table that are made to integrally travel with the guide blocks along the guide rails that are fixed following the step portion having high linearity may be made to come into contact with the blanket roll in the state of the straightness having been increased. With this constitution, it is possible to easily set the attitude of the plate table and print target table corresponding to the blanket roll to a desired attitude, and it is possible to cause the plate on the plate table and the print target on the print target table to make contact by an arrangement that squarely faces the blanket roll.

(3) Moreover, the installation location of the guide rails on the upper surface portion of the frame may be two locations spaced apart by a predetermined interval, and the step portion that consists of a vertical surface and a horizontal surface may be provided at the guide rail mounting locations so that both the vertical surface and the horizontal surface face outward in the width direction or inward in the width direction. With this constitution, it is possible to increase the rigidity of the plate table that travels along the guide rails that are mounted along each step portion at the mounting location of each guide rail with respect to an external force in the lateral direction. Thereby, it is possible to prevent a degradation of the printing accuracy even in the case of an external force acting in the lateral direction on the plate table and the print target table.

(4) Moreover, a step portion that consists of a vertical surface that is formed by a machining process so that the linearity increases and a horizontal surface may be provided at the center portion in the width direction of the frame in a parallel manner to the step portion provided at the mounting locations of the guide rails on the upper surface portion of the frame, one side surface and the lower surface of a stator of a linear motor may be mounted in a state of being pressed against the vertical surface and the horizontal surface of the step portion at the center portion in the width direction of the frame, a step portion that consists of a vertical surface that is formed by a machining process so that the linearity increases and a horizontal surface may be provided at the center portion in the width direction of the bottom surface portion of the plate table and the print target table, and one side surface and the upper surface of a reaction plate of the linear motor may be mounted in a state of being pressed against the vertical surface and the horizontal surface of the step portion. With this constitution, it is possible to make the movement direction of the plate table and the print target table that move along the guide rails and the drive direction when driving the plate table and the print target table by the linear motor accurately agree. Therefore, it is possible to control the movement amount of the plate on the plate table and the print target on the print target table by the linear motor with high accuracy.

(5) Moreover, a step portion that consists of a vertical surface that is formed by a machining process so that the linearity increases and a horizontal surface may be provided at a predetermined location on the upper surface portion of the frame in a parallel manner to the step portion provided at the mounting locations of the guide rails on the upper surface portion of the frame, and one side surface and the bottom surface of a linear scale may be mounted by being pressed against the vertical surface and the horizontal surface of the step portion provided at the predetermined location at the upper surface portion of the frame. With this constitution, it is possible to detect the movement of the plate table and the print target table with the linear scale that is accurately arranged in a parallel manner to the movement direction of the plate table and the print target table that move along the guide rails. Thereby, it is possible to achieve a further increase in the accuracy of controlling the movement amounts of the plate on the plate table and the print target on the print target table.

DESCRIPTION OF PREFERRED EMBODIMENT(S)

Hereinbelow, aspects for carrying out the present invention shall be described with reference to the drawings.

Figure 1:
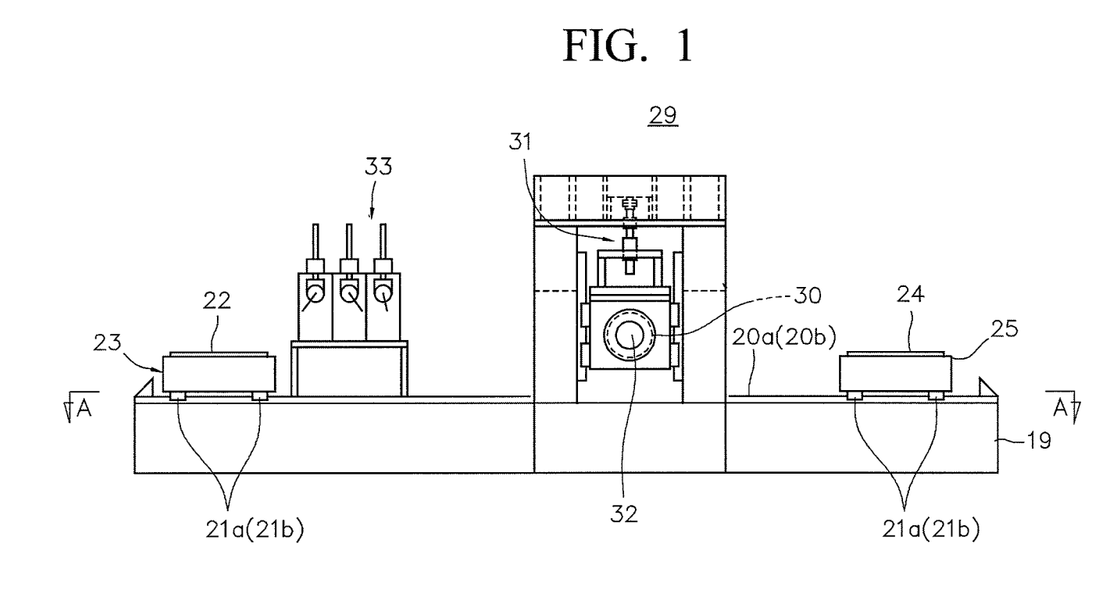
FIG. 1 is an outline side view that shows the offset printing apparatus of one embodiment of the present invention.
Figure 2:
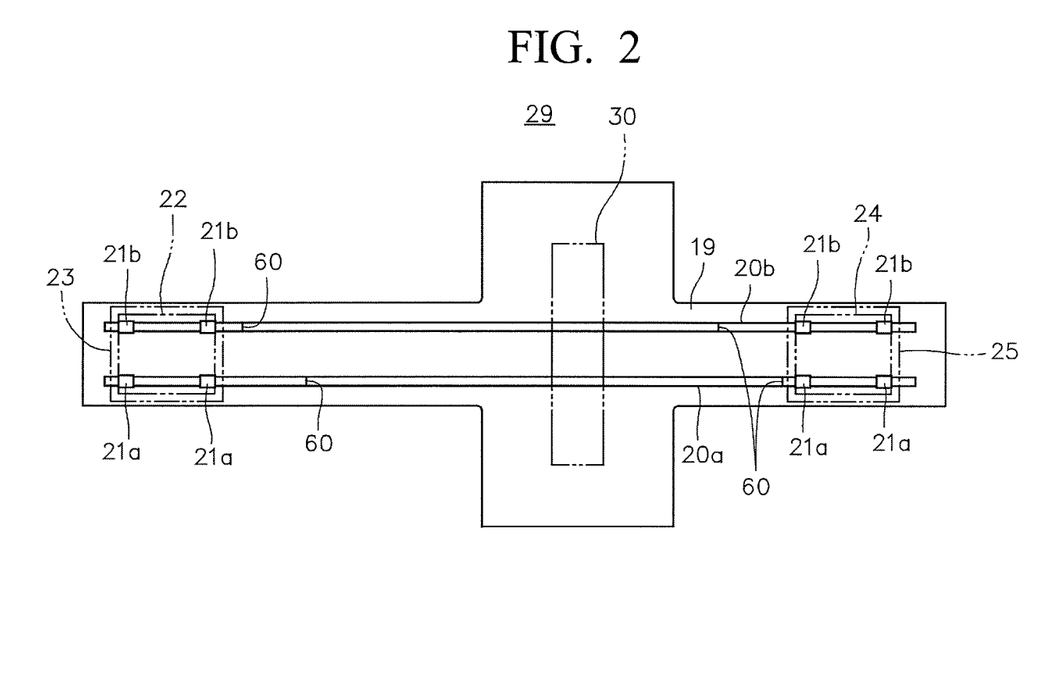
FIG. 2 is a plan view in the direction A-A of the offset printing apparatus of FIG. 1.
Figure 3:
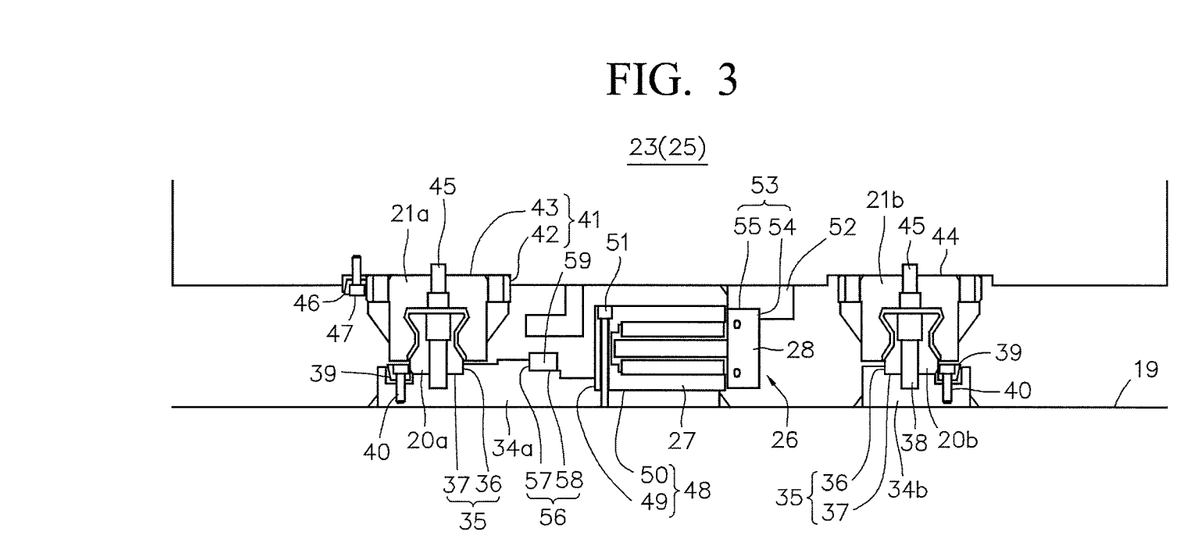
FIG. 3 is a cross-sectional frontal view that shows in an enlarged manner the essential portions of the offset printing apparatus of FIG. 1.

FIG. 1 to FIG. 3 show the offset printing apparatus of one embodiment of the present invention.

First, an overview of the total constitution of the offset printing apparatus of one embodiment of the present invention shall be given. The offset printing apparatus is provided with a horizontal frame 19, a left-right pair of guide rails 20a and 20b that are provided on the upper side of the horizontal frame 19 and that extend in one direction (the X-axis direction), a plate table 23 that is provided on the upper side of the guide rails 20a and 20b and that is capable of holding a flat plate 22, a print target table 25 that is provided on the upper side of the guide rails 20a and 20b and that is capable of holding a flat print target 24 such as a substrate, and a total of four guide blocks 21a and 21b, two each left and right, that are provided on the guide rails 20a and 20b. The plate table 23 and the print target table 25 are attached in a slidable manner to the guide rails 20a and 20b via the guide blocks 21a and 21b.

Furthermore, a stator 27 of a linear motor 26 is installed on the frame 19 along the X-axis direction. A reaction plate 28 of the linear motor 26 is installed on the plate table 23 and the print target table 25, respectively. The plate table 23 and the print target table 25 can perform reciprocating movement (travel) independently along the guide rails 20a and 20b via driving of the linear motor 26.

A transfer mechanism portion 29 that is provided with a blanket roll 30 that is arranged along a direction perpendicular to the lengthwise direction of the guide rails 20a and 20b (Y-axis direction), a lift drive mechanism 31 such as a ball screw mechanism for raising and lowering the blanket roll 30, and a rotation drive motor 32 for rotationally driving the blanket roll 30 is provided on the frame 19 at a location corresponding to the middle portion in the lengthwise direction (X-axis direction) of the guide rails 20a and 20b. Also, an inking apparatus 33 for performing inking of the plate 22 that is held on the plate table 23 is provided at a midway position separate from the transfer mechanism portion 29 in a range that the plate table 23 can travel in the lengthwise direction of the guide rails 20a and 20b on the frame 19, for example, a position removed by a predetermined distance to one end side in the lengthwise direction of the guide rails 20a and 20b from the transfer mechanism portion 29.

Next, the essential portions of the offset printing apparatus of the present invention shall be described with reference to FIG. 3.

At two locations in the left-right width direction that serve as the left and right mounting locations of the guide rails 20a and 20b, base members 34a and 34b for respectively fixing the guide rails 20a and 20b are fixed on the upper surface of the frame 19. The base members 34a and 34b extend in the X-axis direction.

A step portion (positioning shoulder) 35 facing outward in the width direction that consists of a vertical surface 36 and a horizontal surface 37 is provided at the upper surface portion of the base members 34a and 34b fixed on the frame 19 by a machining process such as a polishing process so that the linearity along the X-axis direction of each vertical surface 36 increases. The vertical surfaces 36 of the base members 34a and 34b are mutually parallel. The horizontal surfaces 37 of the base members 34a and 34b are mutually parallel and at the same height level.

Furthermore, the left and right guide rails 20a and 20b are arranged on the base members 34a and 34b. When fixing the left and right guide rails 20a and 20b, one side surface and the bottom surface of each guide rail 20a and 20b that serve as reference surfaces are respectively pressed against the vertical surface 36 and the horizontal surface 37 of each step portion 35 provided on the base members 34a and 34b. In this state, a plurality of locations in the lengthwise direction of the guide rails 20a and 20b separated by a predetermined interval are fixed to the corresponding base members 34a and 34b by a plurality of fixing bolts 38 serving as the horizontal surface pressing portions and a plurality of wedge-shaped guide holding members 39 and fixing bolts 40 thereof serving as the vertical surface pressing portions. Thereby, it is possible to accurately fix the one side surface and the bottom surface of each guide rail 20a and 20b serving as reference surfaces to the vertical surface 36 and the horizontal surface 37 of each step portion 35 provided at the base members 34a and 34b at a predetermined interval in the lengthwise direction of the guide rails 20a and 20b by the wedge-shaped guide holding members 39. Also, it is possible to secure the linearity of the guide rails 20a and 20b in the X-axis direction in accordance with the accuracy of the machining process when providing the step portions 35 on the base members 34a and 34b. Furthermore, by fixing them with the wedge-shaped guide holding members 39, it is possible to increase the rigidity of the guide rails 20a and 20b in the lateral direction.

A step portion (positioning shoulder) 41 that consists of a vertical surface 42 and a horizontal surface 43 is provided on the bottom surface of the plate table 23 and the print target table 25 by a machining process such as a polishing process so that the linearity along the X-axis direction of the vertical surface 42 increases. The step portion 41 is provided at guide block mounting locations among the mounting locations of the left and right guide blocks 21a and 21b that are arranged on the left and right guide rails 20a and 20b, for example, at the mounting locations of the left guide blocks 21a that are arranged on the left-side guide rail 20a, the mounting locations being shown in FIG. 2. Also, at the bottom surface of the plate table 23 and the print target table 25, a horizontal surface 44 that is parallel to and at the same height level as the horizontal surface 43 of the step portion 41 is provided by a machining process such as polishing processing at the mounting locations of the right guide blocks 21b that are arranged on the right-side guide rail 20b, the mounting locations being shown in FIG. 2.

Furthermore, the guide blocks 21a for attaching the plate table 23 and the print target table 25 in a slidable manner to the corresponding guide rail 20a are provided at the one guide block mounting location at which the step portion 41 is provided at the bottom surface of the plate table 23 and the print target table 25. When fixing the guide blocks 21a, one side surface and the upper surface of each guide block 21a that serve as reference surfaces are respectively pressed against the vertical surface 42 and the horizontal surface 43 of the step portion 41 that is provided at the bottom surface of the tables 23 and 25. In this state, the guide block 21a is fixed to the bottom surface of the corresponding tables 23 and 25 by a plurality of fixing bolts 45 serving as the horizontal surface pressing portions and a plurality of wedge-shaped guide holding members 46 and fixing bolts 47 thereof serving as the vertical surface pressing portions. Thereby, it is possible to accurately fix the one side surface and the upper surface of the guide block 21a serving as reference surfaces to the vertical surface 42 and the horizontal surface 43, respectively, of each step portion 41 provided at the bottom surface of the tables 23 and 25 by the wedge-shaped guide holding members 46. Also, it is possible to mount the guide blocks 21a to be mounted on the left-side guide rail 20a in FIG. 3 to the bottom surface of the plate table 23 and the print target table 25 in a state of ensuring the linearity in the X-axis direction in accordance with the accuracy of the mechanical processing when providing the step portion 41. Moreover, by fixing them with the wedge-shaped guide holding members 46, it is possible to increase the rigidity in the lateral direction of the guide blocks 21a.

The guide blocks 21b for attaching the plate table 23 and the print target table 25 in a slidable manner to the other guide rail 20b are arranged at the horizontal surface 44 that is provided at the other guide block mounting location at the bottom surface of the plate table 23 and the print target table 25. The guide blocks 21b are arranged so as to follow the other guide rail 20b, which is provided on the frame 19 in a state of its linearity secured in the X-axis direction, when causing the guide blocks 21a, whose linearity in the X-axis direction is ensured by being positioned by the step portion 41, to slide along the one guide rail 20a that is provided on the frame 19 in a state of its linearity in the X-axis direction secured. The guide blocks 21b are fixed to the bottom surface of the corresponding tables 23 and 25 by the fixing bolts 45, in the same manner as the fixing bolts 45 fix the guide blocks 21a to the bottom surface of the corresponding tables 23 and 25.

With the above constitution, the guide rails 20a and 20b are installed on the frame 19 in a state of their linearity in the X-axis direction secured, and the one guide block 21a among the left and right guide blocks 21a and 21b corresponding to the guide rails 20a and 20b is attached to the plate table 23 and the print target table 25 in the state of its linearity in the X-axis direction secured along the guide rail 20a. Accordingly, during movement of the plate table 23 and the print target table 25, it is possible to guarantee the straightness of the movement in the X-axis direction in accordance with the accuracy of the machining process of the step portion 35 provided at the base members 34a and 34b on the frame 19 and the step portion 41 provided on the bottom surface of the tables 23 and 25.

Furthermore, one base member among the base members 34a and 34b that are attached to the frame 19, for example the left-side base member 34a in FIG. 3, is made to have a width that reaches to the center portion in the width direction of the frame 19. Also, in the base member 34a, a step portion (positioning shoulder) 48 that consists of a vertical surface 49 that is parallel to the vertical surface 36 of the step portion 35 for attachment of the guide rails 20a and 20b, and a horizontal surface 50 is provided at a location corresponding to the center portion in the width direction of the frame 19 by a machining process such as a polishing process so that the linearity along the X-axis direction of the vertical surface 49 increases. In the state of being arranged by pressing one side surface and the bottom surface of the stator 27 of the linear motor 26 serving as reference surfaces against the vertical surface 49 and the horizontal surface 50 of the step portion 48, the stator 27 is fixed to the base member 34a with a fixing bolt 51.

On the other hand, a block-shaped mounting member 52 that has the required vertical dimensions is attached at the intermediate portion in the left-right width direction on the bottom surface of the plate table 23 and the print target table 25. At the lower end portion of the mounting member 52, a step portion (positioning shoulder) 53 that consists of a vertical surface 54, which is parallel to the vertical surface 42 of the step portion 41 provided at the one guide block mounting location at the bottom surface of the tables 23 and 25, and a horizontal surface 55 is provided by a machining process such as a polishing process so that the linearity along the X-axis direction of the vertical surface 54 of the step portion 53 increases. In the state of pressing one side surface and the upper surface of the reaction plate 28 of the linear motor 26 serving as reference surfaces against the vertical surface 54 and the horizontal surface 55 of the step portion 53, the reaction plate 28 is fixed to the mounting member 52 by a fixing portion not illustrated. Thereby, it is possible to guarantee the straightness of movement in the X-axis direction of the linear motor 26 for moving the plate table 23 and the print target table 25 along the guide rails 20a and 20b in accordance with the accuracy of the machining process of the step portion 48 for positioning of the stator 27 that is provided at the base member 34a, and the step portion 53 for positioning of the reaction plate 28 that is provided at the mounting member 52.

Moreover, a step portion (positioning shoulder) 56 that consists of a vertical surface 57, which is parallel to the vertical surface 36 of the step portion 35 for mounting the guide rails 20a and 20b, and a horizontal surface 58 is provided between the mounting location of the one guide rail 20a at the upper surface of the one base member 34a and the mounting location of the stator 27 of the linear motor 26 by a machining process such as a polishing process or the like in which the linearity along the X-axis direction of the vertical surface 57 increases. A linear scale 59 is installed with the vertical surface 57 and the horizontal surface 58 of the step portion 56 serving as reference surfaces. Thereby, the linearity in the X-axis direction is ensured in accordance with the accuracy of the machining process of the step portion 56. Therefore, it is possible to detect with high accuracy the position in the X-axis direction of the plate table 23 and the print target table 25 that move along the guide rails 20a and 20b with the linear scale 59.

Note that the mounting locations of the left and right guide rails 20a and 20b on the frame 19 are, as shown in FIG. 2, preferably arranged further to the inside than the left-right width of the plate 22 and the print target 24 that are respectively held on the plate table 23 and the print target table 25. According to this constitution, as described below, in the transfer mechanism portion 29, when pressing the blanket roll 30 on the plate 22 held on the plate table 23 and on the print target 24 held on the print target table 25 from above in the state of causing a predetermined contact pressure force to act, it is possible to transmit a load that the plate 22 and the print target 24 receive from the blanket roll 30 to the guide rails 20a and 20b that are positioned directly below the plate 22 and the print target 24 via the tables 23 and 25 and the guide blocks 21a and 21b.

Also, when there is a need to extend the left and right guide rails 20a and 20b in the lengthwise direction in order to cover the entire length of the travel range of the plate table 23 and the print target table 25 on the frame 19, as shown in FIG. 2, the joints 60 of the guide rails 20a and 20b are not positioned at the installation location of the transfer mechanism portion 29. Also, the joints 60 themselves of the guide rails 20a and 20b are arranged to be mutually staggered by a predetermined dimension in the X-axis direction. Thereby, it is possible to inhibit disturbances to the travel of the tables 23 and 25 that stem from the plate table 23 and the print target table 25 simultaneously passing over the joints 60 of the left and right guide rails 20a and 20b. Also, it is possible to ensure that disturbances to the travel of the tables 23 and 25 do not occur when passing the transfer mechanism portion 29.

In the case of using the offset printing device of the present invention that has the aforementioned constitution, the plate 22 is held on the plate table 23, and the print target 24 is held on the print target table 25. In this state, inking is performed by moving the plate table 23 that holds the plate 22 to the inking apparatus 33 by the linear motor 26.

Next, the plate table 23 that holds the plate 22 that has been inked, and the print target table 25 that holds the print target 24 are moved to a position that is the upstream side in the table travel direction during transfer from the transfer mechanism portion 29 and put on standby.

Next, when the plate table 23 passes directly under the blanket roll 30 of the transfer mechanism portion 29, the blanket roll 30 that is rotated by a circumferential movement amount synchronized with the amount of movement of the plate 22 on the plate table 23 is pressed from above against the plate 22 on the plate table 23 with a predetermined contact pressure, and the transfer of the ink from the plate 22 to the blanket roll 30 is performed. At this time, the movement direction of the plate table 23 is guided in the state of its straightness being guaranteed by the guide rails 20a and 20b whose linearity in the X-axis direction is secured and whose rigidity is increased in the lateral direction. Also, the plate table 23 is driven by the linear motor 26 whose straightness in the X-axis direction is guaranteed. Furthermore, the detection of the movement amount of the plate table 23 is performed by the linear scale 59 whose straightness in the X-axis direction is secured. Accordingly, it is possible to perform positional control of the plate 22 on the plate table 23 with high accuracy, and the print pattern of the plate 22 is transferred to the surface of the blanket roll 30 with highly precise reproducibility.

Thereafter, when the print target table 25 passes directly below the blanket roll 30 of the transfer mechanism portion 29, the blanket roll 30 that has been rotated by a circumferential movement amount synchronized with the movement amount of the print target 24 on the print target table 25 is pressed from above against the print target 24 on the print target table 25 with a predetermined contact pressure, and retransfer of the ink from the blanket roll 30 to the print target 24 is performed. At this time, similarly to the plate table 23, the movement direction of the print target table 25 is guided in the state of its straightness being guaranteed by the guide rails 20a and 20b whose linearity in the X-axis direction is secured and whose rigidity is increased in the lateral direction. Also, the print target table 25 is driven by the linear motor 26 whose straightness in the X-axis direction is guaranteed. Furthermore, the detection of the movement amount of the print target table 25 is performed by the linear scale 59 whose straightness in the X-axis direction is secured. Accordingly, it is possible to perform positional control of the print target 24 on the print target table 25 with high accuracy, and the print pattern that was transferred from the plate 22 to a surface of the blanket roll 30 is transferred to the surface of the print target 24 with highly precise reproducibility.

In this way, according to the offset printing apparatus of the present invention, it is possible to guide the plate table 23 that holds the plate 22 and the print target table 25 that holds the print target 24 by the same guide rails 20a and 20b under the blanket roll 30 of the transfer mechanism portion 29. Also, the linearity in the X-axis direction of the guide rails 20a and 20b is secured in accordance with the accuracy of the machining process when providing the corresponding step portion 35. Accordingly, it is possible to guarantee the straightness of the plate table 23 that holds the plate 22 and the print target table 25 that holds the print target 24 under the blanket roll 30 of the transfer mechanism portion 29, and it is possible to print the print pattern of the plate 22 on the print target 24 with high positional accuracy and high reproducibility.

Thereby, it is possible to attain extremely high positional accuracy in the case of there being a need to restrict position misalignment of a fine print pattern, such as in electrode pattern formation, to several μm.

Also, the guide rails 20a and 20b are fixed along the vertical surface 36 of the step portion 35 facing outward in the width direction that is provided on the upper surface portion of the base members 34a and 34b fixed on the frame 19. Moreover, the wedge-shaped guide holding member 39 is used as a fixing portion of the guide rails 20a and 20b. Accordingly, it is possible to raise the rigidity with respect to an external force in the lateral direction of the guide rails 20a and 20b. Therefore, it is possible to prevent a degradation of the printing accuracy even in the case of an external force acting in the lateral direction on the guide rails 20a and 20b.

Note that the present invention is not limited to the aforementioned embodiment. In the aforementioned embodiment, the step portion 35 having the vertical surface 36 and the horizontal surface 37 for positioning the mounting position of the guide rails 20a and 20b on the upper surface portion of the frame 19 was provided on the base members 34a and 34b provided on the frame 19, but the step portion 35 may also be provided directly on the upper surface of the frame 19.

Also, in the aforementioned embodiment, the step portion 35 that consists of the vertical surface 36 and the horizontal surface 37 for pressing the side surface and the bottom surface of the guide rails 20a and 20b serving as reference surfaces is provided facing outward in the width direction, but each step portion 35 may also be provided facing inward in the width direction. Even in this case, it is possible to increase the rigidity with respect to an external force in the lateral direction of the guide rails 20a and 20b, and it is possible to prevent a degradation of the printing accuracy even in the case of an external force acting in the lateral direction on the guide rails 20a and 20b.

As the vertical surface pressing portion for pressing the guide rails 20a and 20b against the corresponding vertical surface 36 of the step portion 35 provided on the base members 34a and 34b on the frame 19, and as the vertical surface pressing portion for pressing the guide block 21a against the vertical surface 42 of the step portion 41 provided on the bottom surface of the tables 23 and 25, it is preferable to use the wedge-shaped guide holding members 39 and 46 and the fixing bolts thereof 40 and 47 from the standpoint of accurately fixing them to the step portions 35 and 41 and increasing the rigidity in the lateral direction by causing a pressing force to act on the guide rails 20a and 20b and the guide block 21a from the opposite side of the vertical surfaces 36 and 42 of the step portions 35 and 41. However, provided it is possible to cause a pressing force to act on the guide rails 20a and 20b and the guide block 21a from the opposite side of the vertical surfaces 36 and 42 of the step portions 35 and 41, a vertical surface pressing portion other than the wedge-shaped guide holding members 39 and 46 and the fixing bolts 40 and 47 thereof may be used, such as a cylindrical guide holding member that is provided with an eccentric bolt insertion hole and the fixing bolt thereof.

As for the transfer mechanism portion 29, provided it is capable of causing the blanket roll 30 to make contact from above with the plate 22 that is held by the plate table 23 and the print target 24 that is held by the print target table 25 that travel along the guide rails 20a and 20b, any type of transfer mechanism portion 29 may be used.

As for the inking apparatus 33, provided it is capable of performing adequate inking of the plate 22 held on the plate table 23, any type of inking apparatus 33 may be used.

The offset printing apparatus of the present invention may be applied to the case of performing printing on a print target 24 other than a substrate.

Hereinabove, preferred embodiments of the present invention have been described, but the present invention is not limited to these embodiments. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

According to the offset printing device of the present invention, it is possible to increase the reproducibility of a position when the plate on the plate table makes contact with the blanket roll, and the position when the print target on the print target table makes contact with the blanket roll. Therefore, it is possible to print the print pattern of the plate on the print target via the blanket roll with high positional accuracy and high reproducibility. Therefore, it is possible to attain extremely high positional accuracy in the case of there being a need to restrict position misalignment of a fine print pattern, such as in electrode pattern formation, to several μm.

The invention claimed is:

1. An offset printing apparatus comprising:
   a frame;
   a plurality of base members that are provided on the frame;
   guide rails, each of the guide rails being directly and fixedly attached to at least one of the plurality of base members;
   a plurality of guide blocks that are provided on the guide rails;
   a plate table for holding a plate that travels via one portion of the guide blocks among the plurality of guide blocks;
   a print target table for holding a print target that travels via another portion of the guide blocks among the plurality of guide blocks; and
   a blanket roll that is provided on the frame;
   wherein:
   transfer from the plate that is held on the plate table to the blanket roll, and retransfer from the blanket roll to the print target that is held on the print target table are performed by causing the blanket roll to successively make contact from above with the plate that is held on the plate table, and with the print target that is held on the print target table;
   a plurality of step portions for positioning are provided, each of the plurality of the step portions consisting of a vertical surface that is formed by a machining process so that the linearity increases and a horizontal surface at a respective mounting location of a respective guide rail on an upper surface portion of a respective base member;
   a side surface and a bottom surface of each of the guide rails are pressed against the vertical surface and the horizontal surface, respectively, of the respective step portion to be fixed to the respective step portion; and
   one of the plurality of the base members extends to a center portion in a width direction of the frame.

2. The offset printing apparatus according to claim 1, wherein
   a step portion that consists of a vertical surface that is formed by a machining process so that the linearity increases and a horizontal surface is provided at locations that are arranged above the guide rails at a bottom surface portion of each of the plate table and the print target table; and
   a side surface and an upper surface of one of the guide blocks are pressed against the vertical surface and the horizontal surface, respectively, of the respective step portion to be fixed to the respective step portion.

3. The offset printing apparatus according to claim 1, wherein
   each of the guide rails has a mounting location on the upper surface portion of the respective base member, the mounting locations being spaced apart by a predetermined interval, and
   each of the plurality of step portions is arranged at the respective mounting location of the respective guide rail so as to face outward from the center portion of the frame in the width direction of the frame.

4. The offset printing apparatus according to claim 1, wherein
   a step portion that consists of a vertical surface that is formed by a machining process so that the linearity increases and a horizontal surface is provided in one of the plurality of base members at a location corresponding to the center portion in the width direction of the frame, such that the vertical surface is parallel to the vertical surface of each of the plurality of step portions provided at the respective mounting location of the respective guide rail on the upper surface portion of the respective base member;
   a side surface and a lower surface of a stator of a linear motor are mounted in a state of being pressed against the vertical surface and the horizontal surface, respectively, of the step portion provided in the one of the plurality of base members;
   a step portion that consists of a vertical surface that is formed by a machining process so that the linearity increases and a horizontal surface is provided at a center portion in a width direction of a bottom surface portion of each of the plate table and the print target table; and
   a side surface and an upper surface of a reaction plate of the linear motor are mounted in a state of being pressed against the vertical surface and the horizontal surface, respectively, of the step portion at the center portion in the width direction of the bottom surface portion of each of the plate table and the print target table.

5. The offset print apparatus according to claim 1, wherein
   a step portion that consists of a vertical surface that is formed by a machining process so that the linearity increases and a horizontal surface is provided at a predetermined location on the upper surface portion of one of the plurality of base members, such that the vertical surface is parallel to the vertical surface of each of the plurality of step portions provided at the respective mounting location of the respective guide rail on the upper surface portion of the respective base member; and
   a side surface and a bottom surface of a linear scale are mounted by being pressed against the vertical surface and the horizontal surface, respectively, of the step portion provided at the predetermined location on the upper surface portion of the one of the plurality of base members.

* * * * *